(12) United States Patent
Shimizu et al.

(10) Patent No.: US 8,598,939 B2
(45) Date of Patent: Dec. 3, 2013

(54) SWITCH CIRCUIT AND SEMICONDUCTOR CIRCUIT

(75) Inventors: Tetsuhiro Shimizu, Kokubunji (JP); Satoshi Hanazawa, Hamura (JP); Toshio Shinomiya, Ome (JP); Hiroyasu Yoshizawa, Hamura (JP)

(73) Assignee: Hitachi, Ltd., Tokyo (JP)

( * ) Notice: Subject to any disclaimer, the term of this patent is extended or adjusted under 35 U.S.C. 154(b) by 33 days.

(21) Appl. No.: 13/350,801

(22) Filed: Jan. 15, 2012

(65) Prior Publication Data

US 2012/0249210 A1 Oct. 4, 2012

(30) Foreign Application Priority Data

Mar. 30, 2011 (JP) ................................ 2011-073891

(51) Int. Cl.
*H03K 17/13* (2006.01)

(52) U.S. Cl.
USPC .......................................................... 327/436

(58) Field of Classification Search
USPC .......................................................... 327/436
See application file for complete search history.

(56) References Cited

U.S. PATENT DOCUMENTS

| | | | |
|---|---|---|---|
| 6,118,189 A * | 9/2000 | Flaxl ................................ 307/112 |
| 6,509,781 B2 * | 1/2003 | Dufort ............................ 327/434 |
| 6,956,426 B2 * | 10/2005 | Wodnicki ....................... 327/382 |
| 7,215,189 B2 * | 5/2007 | Wilhelm ......................... 327/589 |
| 7,521,984 B2 * | 4/2009 | Ricotti ............................ 327/427 |
| 7,746,152 B2 * | 6/2010 | Nakatani et al. ............... 327/389 |
| 7,898,329 B1 * | 3/2011 | Clara et al. ..................... 330/254 |
| 8,149,042 B2 * | 4/2012 | Nakahara et al. .............. 327/308 |
| 2010/0277220 A1 * | 11/2010 | Stoerk et al. ................... 327/437 |
| 2010/0321966 A1 * | 12/2010 | Mochikawa et al. .......... 363/123 |
| 2012/0161819 A1 * | 6/2012 | Rossi et al. ..................... 327/109 |
| 2013/0009691 A1 * | 1/2013 | Blanken et al. ................ 327/425 |

FOREIGN PATENT DOCUMENTS

JP 2004-363997 A 12/2004
WO WO 2011/128809 * 10/2011

* cited by examiner

*Primary Examiner* — Thomas J Hiltunen
(74) *Attorney, Agent, or Firm* — Miles & Stockbridge P.C.

(57) ABSTRACT

A T/R switch applicable to an ultrasonograph and capable of transmitting a signal reflected from a living body over a wide band with low noise without causing erroneous operation of the switch or element destruction even when the potential of a transmission signal or reflected signal changes includes: a common source terminal commonly and serially coupling the source terminals of two MOS transistors; a common gate terminal commonly coupling the gate terminals of the two MOS transistors; a main switch, the drain terminals of which are connected to input/output terminals; and a floating voltage circuit which is connected to the common gate terminal and common source terminal, makes the common gate terminal potential follow, in phase, variation in the common source terminal potential, and sends a signal to turn the switch on or off to the common gate terminal.

14 Claims, 6 Drawing Sheets

SWITCH CIRCUIT AND SEMICONDUCTOR CIRCUIT

CLAIM OF PRIORITY

The present application claims priority from Japanese patent application JP 2011-073891 filed on Mar. 30, 2011, the content of which is hereby incorporated by reference into this application.

FIELD OF THE INVENTION

The present invention relates to technology for a switch circuit which can be integrated on a semiconductor substrate.

BACKGROUND OF THE INVENTION

Among the transmission/reception switch circuits for application to ultrasonographs, there have been switch circuits each of which, having two MOS transistors, a main switch connected to a common source of the two MOS transistors, a drive circuit connected to a common gate of the two MOS transistors and a holding circuit, holds an on-state or off-state of the switch (see Japanese Unexamined Patent Application Publication No. 2004-363997, for example).

SUMMARY OF THE INVENTION

To achieve image accuracy improvement and device multifunctionality in development of medical ultrasonographs, it becomes necessary to enhance resolution by increasing the number of channels. Such an approach leads to enlarging the scale of circuits for use in ultrasonographs and results in increasing power consumption by ultrasonographs. Hence, they have been continuously promoting circuit integration in analog front end sections of ultrasonographs and power consumption reduction.

Generally, signals transmitted from a transmitter of an ultrasonograph are high-voltage signals, and they overload receivers receiving and amplifying reflected signals. As a countermeasure, a transmission/reception switch (T/R switch) is provided in a stage preceding the receiver of each ultrasonograph. When a signal is transmitted, the T/R switch is turned off so as to protect the receiver. When a signal is received, the T/R switch is turned on to allow a signal reflected from a living body to reach the receiver section. The signal reflected from a living body is a weak ultrasonic signal (of several to several tens of MHz), so that the T/R switch is required to have a low-noise characteristic and be capable of handling high-frequency signals without generating much switching noise.

An object of the present invention will be described with reference to FIG. 6, which is a rearranged diagram showing a switch circuit disclosed in Japanese Unexamined Patent Application Publication No. 2004-363997, as an example for comparison. The circuit shown in FIG. 6 includes: a main switch having two NMOS transistors M1 and M2 connected to a common source; a holding circuit formed of a latch circuit having NMOS transistors M3 and M4, zener diodes D3 and D4 and capacitors C1 and C2 connected to the common source; and NMOS transistors M5 and M6 and diodes D1 and D2 which control switching of the main switch and terminals Set and Reset through which control signals for switching control are inputted.

The main switch is turned on by turning M5 on and M6 off. At this time, C1 in the latch circuit and capacitance Cgs between the gate and source of each of M1 and M2 in the main switch circuit are charged up to around Vdc to turn the main switch circuit on. After they are charged, even if M5 is turned off, the charges held by C1 and Cgs can maintain the on-state of the main switch circuit without requiring any steady current flow. The main switch is turned off by turning M5 off and M6 on. At this time, the gate voltage of M3 rises to put M3 in an on-state and the charges held by C1 and Cgs are discharged via the common source thereby causing the main switch circuit to be turned off.

The on-state of the above main switch is, however, maintained only by the capacitance of charged Vgs section. Also, since the control signal from the holding circuit is sent directly to M1 and M2 in the main switch circuit, the state of the holding circuit can change, for example, when charges are discharged from M1 and M2 due to gate leakage or when the input signal voltage changes causing crosstalk via Cgd1, Cgd2 and Cgs in the main switch circuit. This makes it difficult to maintain the on- or off-state of the main switch for an extended period of time and can cause erroneous on/off operation of the switch circuit.

Furthermore, when a negative high voltage (−HV) is applied from GND via an input/output terminal, the voltage of the common source S quickly follows the applied voltage thanks to the parasitic diode M1, but the voltage of the common gate G cannot instantaneously follow the applied voltage. This causes a high voltage to be instantaneously applied to C1 and between the gate and source of each of M1 and M2 to possibly break the respective elements.

In view of the above, it is an object of the present invention to realize a T/R switch which can transmit a signal reflected from a living body to a receiver with low noise over a wide frequency band without causing erroneous operation of the switch or element destruction even when the potential of a transmission signal or reflected signal changes.

A typical configuration of the present invention is as follows.

A switch circuit includes: a main switch having a first MOS transistor, to a drain terminal of which a first input/output terminal is connected, and a second MOS transistor, to a drain terminal of which a second input/output terminal is connected, wherein a source terminal of the first MOS transistor and a source terminal of the second MOS transistor are connected forming a common source terminal and wherein a gate terminal of the first MOS transistor and a gate terminal of the second MOS transistor are connected forming a common gate terminal; and a voltage control circuit which is connected to the common source terminal and the common gate terminal of the main switch, which makes potential of the common gate terminal follow, in phase, variation in common source potential (potential of the common source terminal), and which controls, using a gate control signal, turning on or off of the main switch.

The present invention makes it possible to realize a T/R switch which can transmit a signal reflected from a living body to a receiver over a wide frequency band and with low noise without causing erroneous operation of the switch or element destruction even when the potential of a transmission signal or reflected signal changes.

DETAILED DESCRIPTION OF THE PREFERRED EMBODIMENTS

Embodiments of the present invention will be described below in detail based on drawings. Circuit elements included in each block of each embodiment are, for example, publicly known low-voltage and high-voltage CMOS transistors, resistors, capacitors, diodes, and current sources formed, using integrated circuit technology, on a single semiconductor substrate such as monocrystal silicon.

First Embodiment

Figure 1:
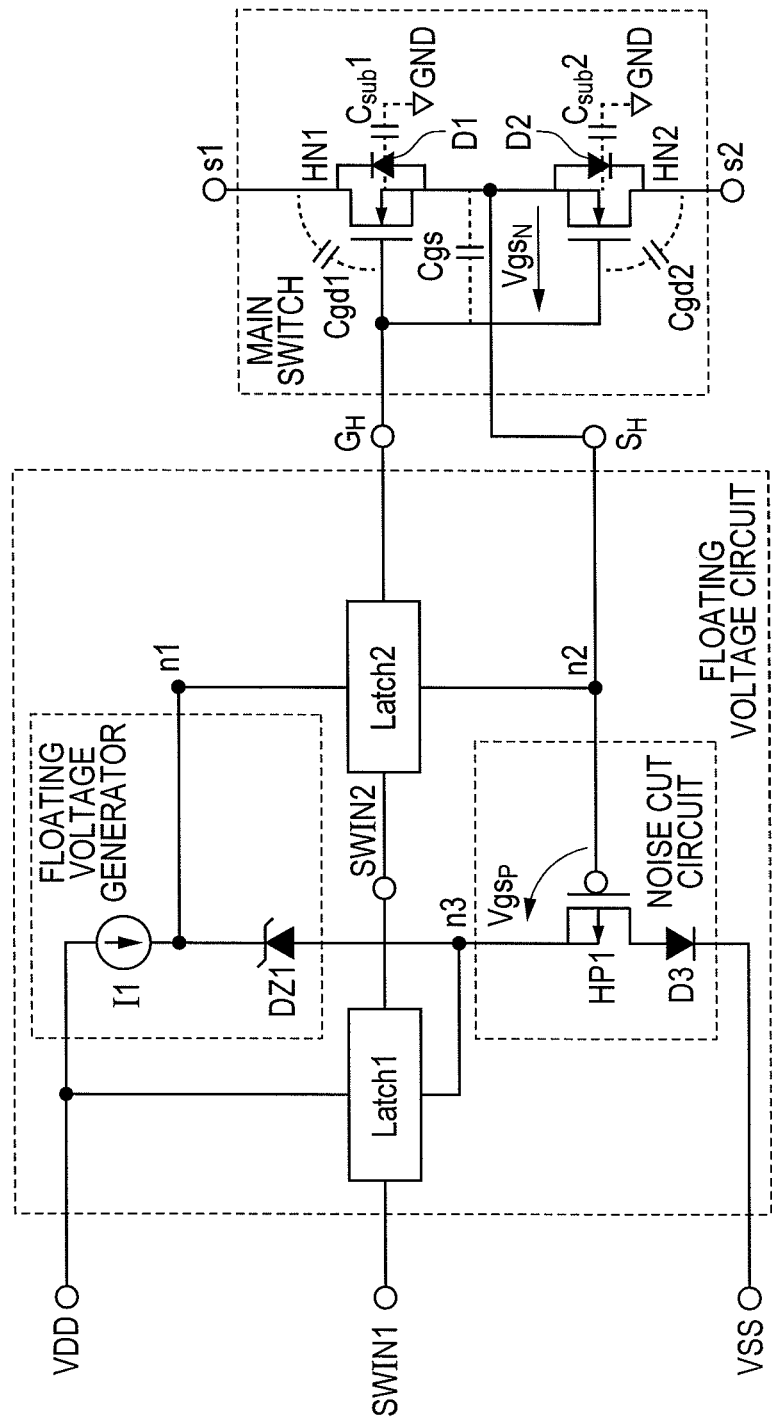
FIG. 1 is a diagram showing the configuration of a switch circuit according to a first embodiment.

FIG. 1 is a diagram showing a first embodiment of a switch circuit including a main switch and a floating voltage circuit.

The main switch includes two NMOS transistors HN1 and HN2 and two parasitic diodes D1 and D2 of the two NMOS transistors. The source terminals and gate terminals of the NMOS transistors HN1 and HN2 are connected to a common source terminal $S_H$ and a common gate terminal $G_H$, respectively. The drain terminals of NMOS transistors HN1 and HN2 are connected to input/output terminals s1 and s2, respectively. The two NMOS transistors HN1 and HN2 each have an on-resistance of several ohms causing the main switch to have an on-resistance of about 10 ohms.

The floating voltage circuit includes a first latch circuit Latch1, a second latch circuit Latch2, a floating voltage generator, and a noise cut circuit.

The first latch circuit Latch1 shifts the level of a switch control input signal to the level of a main switch control signal SWIN2. The switch control input signal uses 0 V inputted from an input terminal SWIN1 as a reference signal L and the potential of a reference power supply VDD as a reference signal H. The main switch control signal SWIN2 uses the potential of the common source terminal $S_H$ as a reference. The second latch circuit Latch2 generates, based on the input main switch control signal SWIN2, a gate control signal to be sent to the common gate terminal $G_H$. The floating voltage generator includes a constant current source I1 and a zener diode DZ1, generates, using the potential of the common source $S_H$ as a reference, a voltage required to perform on-control of the main switch, and supplies the generated voltage as a power supply for the second latch circuit Latch2 from a node n1. The noise cut circuit includes a source follower circuit having a PMOS transistor HP1 whose gate terminal is connected to the common source terminal $S_H$ and a diode D3 whose anode is connected to the drain terminal of the PMOS transistor HP1 and whose cathode is connected to a reference power supply VSS. The noise cut circuit separates a node n2 connected to the common source terminal $S_H$ the potential of which is used as a reference potential for the second latch circuit Latch2 and a node n3 the potential of which is used as a reference potential for the first latch circuit Latch1 and thereby causes the currents generated by the first latch circuit Latch1 and the floating voltage generator to flow to the reference power supply VSS.

To turn on the main switch included in the switch circuit of the present embodiment, a signal L is inputted to the input terminal SWIN1. The input signal causes the first latch circuit. Latch1 to function as a level shifter and, as a result, potential L' higher than the potential of the common source terminal $S_H$ by the gate-source potential Vgsp of the PMOS transistor HP1 is outputted to the switch circuit control signal SWIN2.

The floating voltage generator keeps, using the constant current source I1 connected to the reference power supply VDD, a current flowing so as to keep the potential of the node n1 equal to the sum of the potential of the common source terminal $S_H$, the gate-source potential Vgsp of the PMOS transistor HP1, and the breakdown voltage VZ of the zener diode DZ1.

The second latch circuit Latch2 receives, based on the potentials of the node n1 and node n2, an on-control signal SWIN2 and provides the common gate terminal $G_H$ with a potential equal to the sum of the potential of the common source terminal $S_H$, the gate-source potential Vgsp of the PMOS transistor HP1, and the breakdown voltage VZ of the zener diode DZ1. As a result, a potential equal to the sum of Vgsp and VZ is applied between the gate and source of each of the NMOS transistors causing the main switch to turn on.

To turn off the main switch, a signal H is inputted to the input terminal SWIN1. The input signal causes the first latch circuit Latch1 to function as a level shifter and, as a result, a potential H' equal to the sum of the potential of the common source terminal $S_H$, the gate-source potential Vgsp of the PMOS transistor HP1, and the breakdown voltage VZ of the zener diode DZ1 is outputted to the switch circuit control signal SWIN2.

The second latch circuit Latch2 receives the off-control signal SWIN2 and outputs, based on the potentials of the node n1 and node n2, a gate control signal so as to equalize the potentials of the common gate terminal $G_H$ and common source terminal $S_H$. As a result, the potential difference between the gate and source of each of the NMOS transistors becomes 0 causing the main switch to turn off.

Switch circuit operation performed when the above-described switch circuit is applied to a transmission/reception (T/R) switch circuit of an ultrasonograph with a transmitter thereof connected to an input/output terminal s1 and a receiver section thereof connected to an input/output terminal s2 will be described below.

To turn on the main switch and allow a received signal $\Delta V1$ to pass through from the input/output terminal s1 to the input/output terminal s2, the potentials of the common source terminal $S_H$ and the node n2 are equalized with the potential of the received signal $\Delta V1$. Since variation in the potential of the node n2 is inputted to the gate terminal of the PMOS transistor HP1, the potential of the node n3 becomes equal to the sum of the gate-source potential Vgsp of the PMOS transistor HP1 and $\Delta V1$. The floating voltage generator generates, based on the potential of the node n3, a potential equal to the sum of VZ, Vgsp, and $\Delta V1$ at the node n1.

The second latch circuit Latch2 gives a gate control signal to the common gate terminal $G_H$ based on the potentials of the nodes n1 and n2. Therefore, during on-operation, the common gate terminal $G_H$ can follow in phase the varying potential of the common source terminal $S_H$, keeping the potential difference VZ+Vgsp constant. Hence, the gate-source potential variation $\Delta Vgs$ of each of the NMOS transistors HN1 and HN2 in the main switch becomes 0 ($\Delta Vgs=0$), so that gate-drain capacitance Cgd and gate-source capacitance Cgs are neither charged nor discharged. This makes Cgd+Cgs virtually zero, so that substrate capacitance Csub1+Csub2 is the only capacitance generated between ground and the NMOS transistors HN1 and HN2. This enables transmission of a received signal over a wide frequency band without causing elements to break down.

Even though the on-resistance of HN1 and HN2 that can cause thermal noise can be reduced by enlarging the elements, doing so increases parasitic capacitance. Since, however, parasitic capacitance is greatly reduced in the above-described configuration with Cgd+Cgs being zero, the elements can be made larger to reduce the on-resistance while keeping the parasitic capacitance small. Thus, the switch circuit of the present embodiment is capable of low-noise transmission of a received signal.

Furthermore, in the configuration with Latch2 provided between Latch1 and the main switch, even when a voltage change via the input/output terminal s1 causes crosstalk via Cgd and Cgs, Latch1 maintaining an on- or off-state is not easily affected. Hence, the present embodiment is also effective in preventing malfunction of the main switch.

If current generated when Latch1 or Latch2 is turned on or off or current generated by the current source I1 of the floating voltage generator is allowed to flow to the input/output terminals s1 and s2 via the common source terminal $S_H$ of the main switch, voltage noise may be generated by the resistance loads of the transmitter and receiver section connected to the input/output terminals s1 and s2, causing the noise to be superimposed on the received signal passing the input/output terminals s1 and s2.

In the present embodiment, the noise cut circuit is connected between the nodes n2 and n3, so that the current generated when a signal inputted to the switch from SWIN1 is level-shifted at Latch1 and the current from the current source I1 included in the floating voltage generator are led to the reference power supply VSS via the source and drain of the PMOS transistor HP1 and the diode D3.

Therefore, the current generated when the control signal sent to the common gate terminal $G_H$ is switched by Latch2 is the only current that flows, via the node n2, through the common source terminal $S_H$. The current generated at Latch2 that switches the control signal comprised of the potential difference VZ+Vgsp is much smaller than the current generated when the input signal is level-shifted at Latch1. It is, therefore, possible to realize a T/R switch with a very low noise characteristic.

Thus, without coupling the nodes n2 and n3 to equalize their potentials, providing the noise cut circuit between the nodes n2 and n3 makes it possible to realize a low noise characteristic in addition to a wide band characteristic.

Second Embodiment

Figure 2:
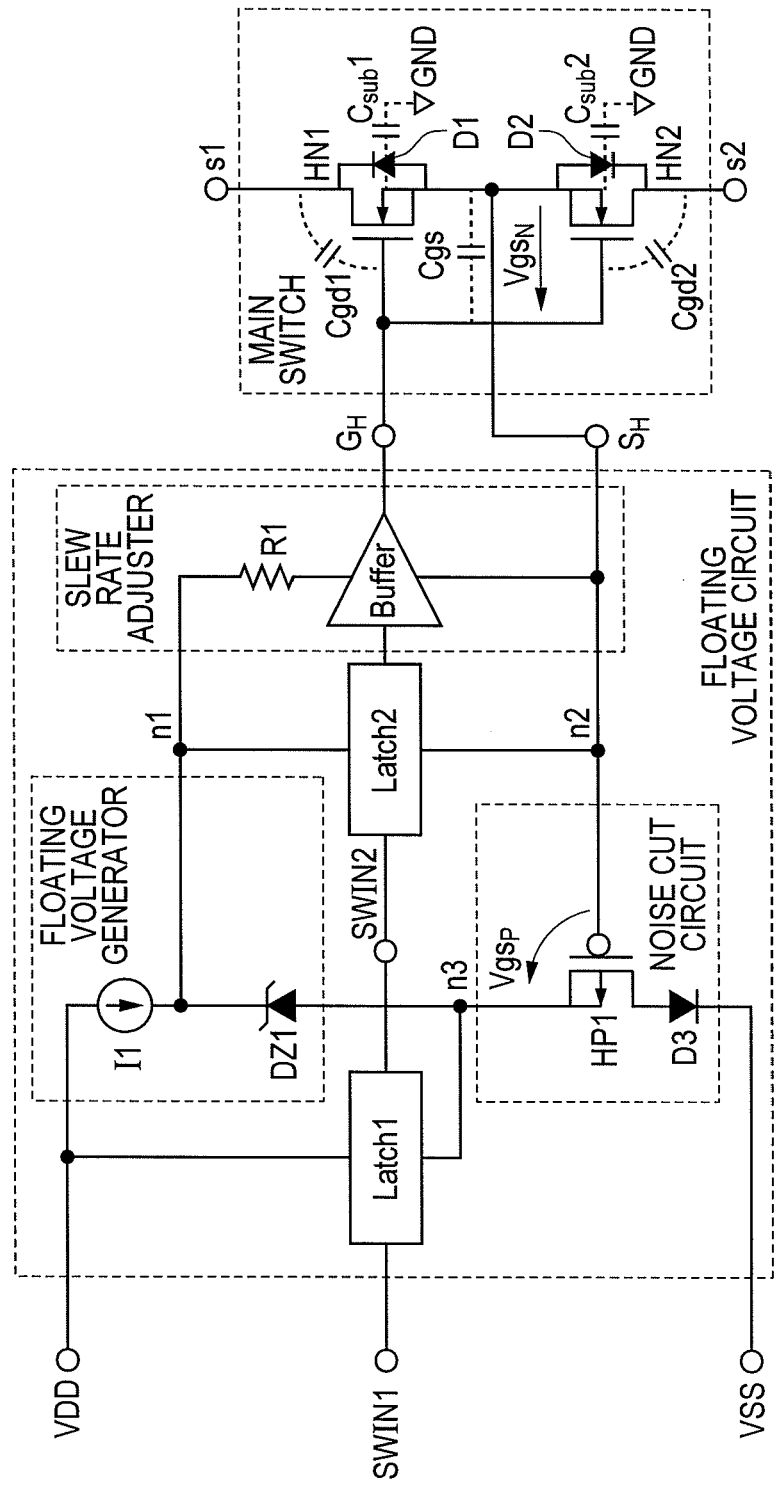
FIG. 2 is a diagram showing the configuration of a switch circuit according to a second embodiment.

FIG. 2 is a diagram showing a second embodiment of a switch circuit including a main switch and a floating voltage circuit.

The switch circuit of the second embodiment includes the switch circuit configuration shown in FIG. 1 with a slew rate adjuster additionally provided between the output terminal of Latch2 and the common gate terminal $G_H$. The slew rate adjuster is connected to the nodes n1 and n2, and includes a buffer which operates with the potential generated in the floating voltage generator and the potential of the common source terminal $S_H$ with a resistor R1 connected between the node n1 and the buffer.

In the present embodiment, the slew rate of the gate control signal is varied by making the gate control signal outputted from Latch2 pass through the buffer. When turning on the main switch which is in an off-state, an on signal equaling the sum of the common source terminal potential, Vgsp and VZ is outputted from the output terminal of Latch2 and the on signal is buffered in the buffer circuit. At this time, the resistor R1 connected to the node n1 reduces the slew rate of the main switch being turned on.

This makes it possible to reduce the currents flowing to the input terminals s1 and s2 when the gate parasitic capacitances Cgd and Cgs of the NMOS transistors HN1 and HN2 are charged. By reducing the currents that can generate noise via external loads, noise superimposition on a signal received during reception operation can be greatly reduced.

Third Embodiment

Figure 3:
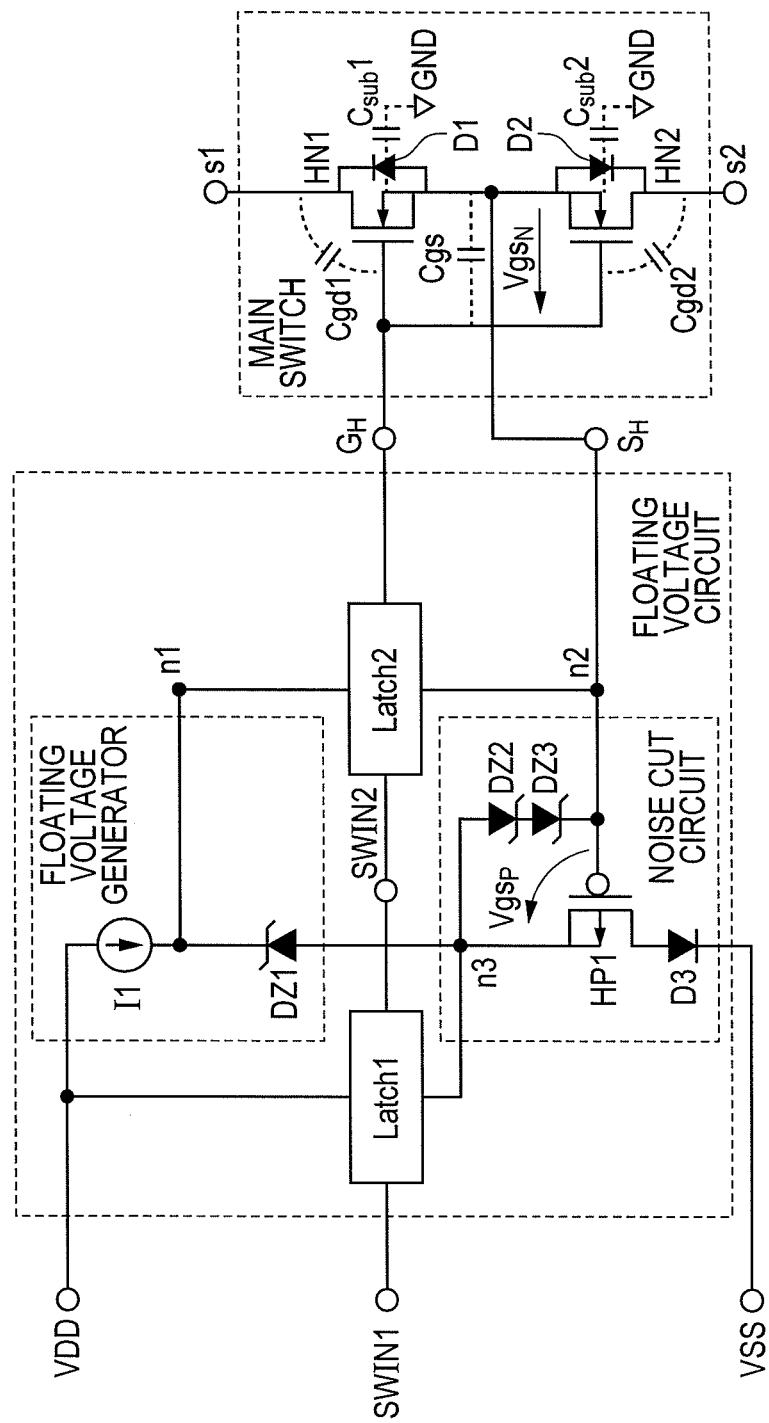
FIG. 3 is a diagram showing the configuration of a switch circuit according to a third embodiment.

FIG. 3 is a diagram showing a third embodiment of a switch circuit including a main switch and a floating voltage circuit.

The switch circuit of the third embodiment is equivalent to the switch circuit shown in FIG. 1 additionally including zener diodes DZ2 and DZ3 connected in series to the node n2 to which the gate terminal of the PMOS transistor HP1 included in the noise cut circuit is connected and to the node n3 to which the source terminal of the PMOS transistor HP1 is connected. The zener diodes DZ2 and DZ3 are connected to the node n3 on their anode side and to the node n2 on their cathode side.

In the present embodiment, gate control for the main switch is performed by the same means as used in the first embodiment. When the main switch is turned on and a received signal ΔV1 is made to pass through from the input/output terminal s1 to the input/output terminal s2, the potential of the common source terminal $S_H$ and the potential of the node n2 become equal to the potential of the received signal ΔV1. When the received signal ΔV1 passes the main switch, the gate-source voltage Vgsp of the PMOS transistor HP1 is smaller than the sum, 2 VDth of threshold voltages of DZ2 and DZ3, so that the currents from Latch1 and I1 flow to the reference power supply VSS via the drain and source of the PMOS transistor HP1 without passing through DZ2 and DZ3.

When the main switch is turned off and a +Vout signal is applied to the input/output terminal s1 from a general transmitter used in an ultrasonograph, the potential of the common source terminal $S_H$ is fixed at a potential equal to the sum of the potential of the input/output terminal s2 and the threshold voltage VF of the parasitic diode D2 included in the NMOS transistor HN2. If the input/output terminal s2 is grounded when the +Vout signal is received, the potential of the common source terminal $S_H$ will become VF (1 V or lower). Then, the same as when the main switch is turned on, the currents from Latch1 and I1 flow to the reference power supply VSS via the drain and source of the PMOS transistor HP1, so that the potentials of the common source terminal $S_H$ and common gate terminal $G_H$ are kept equal.

When the main switch is turned off and a −Vout signal is applied to the input/output terminal s1 from a general transmitter used in an ultrasonograph, the potential of the common source terminal $S_H$ follows the −Vout signal via the parasitic diode D1 of the NMOS transistor HN1. Namely, the potential of the common source terminal $S_H$ changes to a potential equal to the sum of the potential of the input/output terminal s1 and the threshold voltage VF of the parasitic diode D1 of the NMOS transistor HN1 (−Vout+VF). Hence, the potential of the node n3 connected to the source terminal of the PMOS transistor HP1 becomes equal to the sum of −Vout, VF, and Vgsp. When, however, the potential of the node n3 becomes lower than the potential (VSS+VF) determined by the reference power supply VSS and the threshold voltage of the diode D3, the PMOS transistor HP1 enters an off-state, so that the currents from Latch1 and the constant current source I1 can no longer flow to the reference power supply VSS. When this occurs, the potential of the node n3 cannot follow a sudden change in the potential of the node n2 and, as a result, the PMOS transistor HP1 is possibly broken.

In the present embodiment, to avoid such an occurrence, the zener diode DZ2 is connected on its anode side to the node n3 and the zener diode DZ3 is connected on its cathode side to the node n2 so as to cause, when the potential of the node n3 differs 2VF or more from the potential of the node n2, the currents from Latch1 and I1 to flow to the common source terminal $S_H$ via DZ2 and DZ3.

This enables the node n3 to follow the potential of the node n2 even when a signal with a voltage of −Vout is inputted to the input/output terminal s1 causing the potential of the node n2 to sharply change, so that the off signal for the main switch is stably maintained to protect the floating voltage circuit.

Also, with the diode D3 provided between the drain of the PMOS transistor HP1 and the reference power supply VSS, application, upon a potential drop at the node n2, of a high voltage between the gate and drain of the PMOS transistor HP1 is prevented. This allows a small transistor with a low withstand voltage to be used as the PMOS transistor HP1.

Assume a case in which: the main switch is turned off; a −Vout signal is applied to the input/output terminal s1 from a general transmitter used in an ultrasonograph; and, after a certain period of time, a +Vout signal is inputted from the input/output terminal s1. In this case, the potential change that takes place when the signal applied changes from −Vout to +Vout causes the current from the constant current source I1 to flow to the nodes n2 and n3 and the potential of the common source terminal $S_H$ to rise from the sum of −Vout and VF. When the signal applied exceeds 0 V with the input/output terminal s2 grounded, the potential of the common source terminal $S_H$ is fixed at the threshold voltage VF of the parasitic diode D2 of the NMOS transistor HN2 and the potential of the node n3 is fixed at the sum of VF and Vgsp.

At this time, the PMOS transistor HP1 enters an on-state and the current from the constant current source I1 flows to the reference power supply VSS. Subsequently, a +Vout signal is applied to the input/output terminal s1 with the potentials of the common source terminal $S_H$ and node n3 fixed. Hence, the common source terminal $S_H$ and common gate terminal $G_H$ can quickly follow changes in the potential of the ±Vout signals so as to stably maintain the off-operation of the main switch.

Fourth Embodiment

Figure 4:
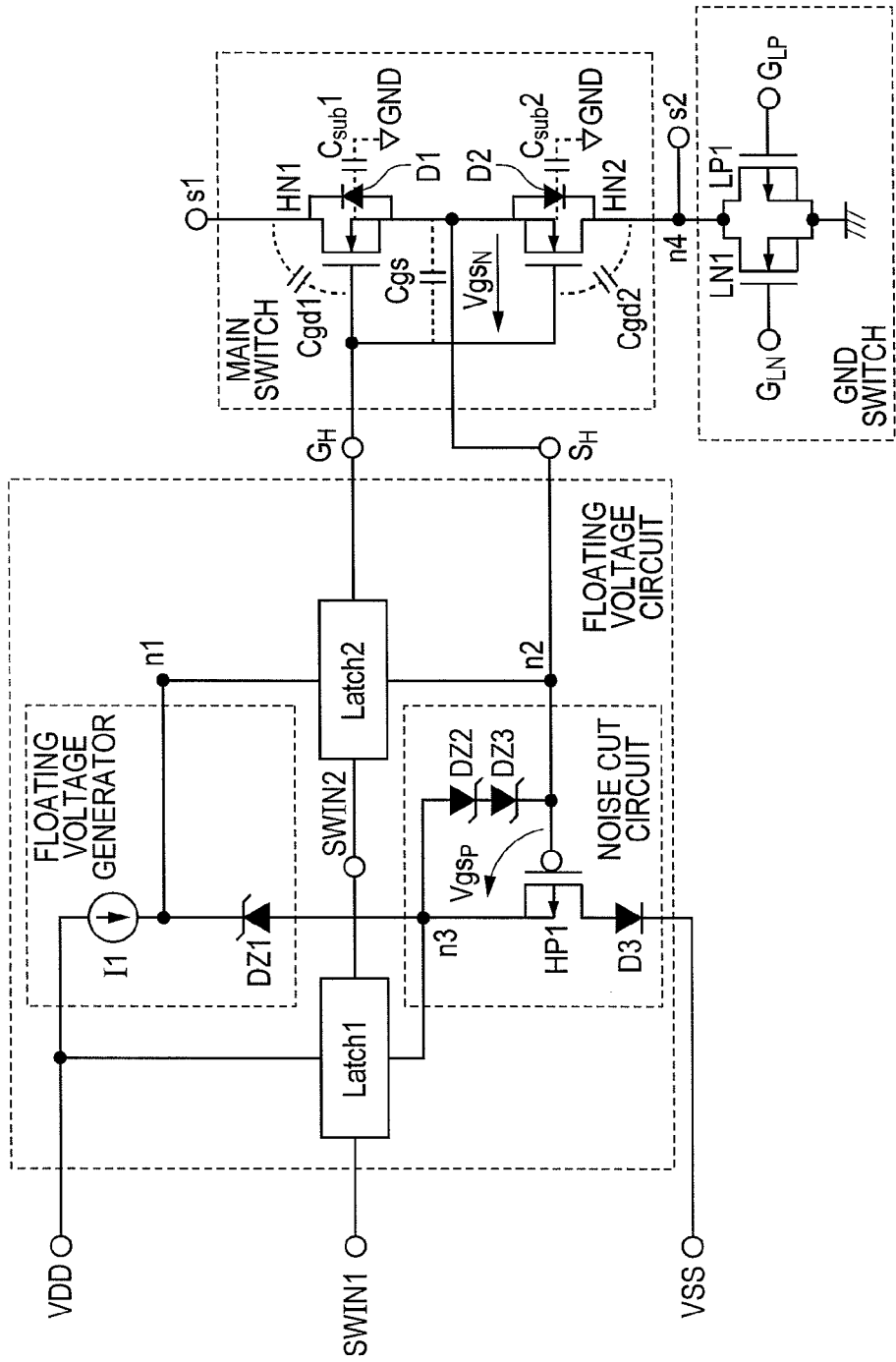
FIG. 4 is a diagram showing the configuration of a switch circuit according to a fourth embodiment.

FIG. 4 is a diagram showing a fourth embodiment of a switch circuit including a main switch and a floating voltage circuit.

The switch circuit of the fourth embodiment is equivalent to the switch circuit shown in FIG. 3 additionally provided with a GND switch connected to the input/output terminal s2.

The GND switch includes a PMOS transistor LP1 and an NMOS transistor LN1. The drains of LP1 and LN1 are connected to a common drain terminal which is connected to the input/output terminal s2 of the main switch. The sources of LP1 and LN1 are connected to a grounded common source terminal. An LP1 control terminal $G_{LP}$ is connected to the gate terminal of LP1. An LN1 control terminal $G_{LN}$ is connected to the gate terminal of LN1. Signals applied to the $G_{LP}$ and $G_{LN}$ are simultaneously controlled so as to turn on and off LP1 and LN1 simultaneously.

The GND switch operates complementarily to the main switch. Namely, when the main switch turns on, a signal L is inputted to $G_{LP}$ and $G_{LN}$ causing the GND switch to turn off and, when the main switch turns off, a signal H is inputted to $G_{LP}$ and $G_{LN}$ causing the GND switch to turn on.

Now, assume a case where: a transmitter used in a general ultrasonograph is connected to the input/output terminal s1; a receiver is connected to a node n4 where the input/output terminal s2 and the GND switch are connected; and the main switch is turned off. When a signal of a maximum of ±Vout transmitted from the transmitter is inputted to the input/output terminal s1, the input signal is clamped by the parasitic diode D1 or D2 of the NMOS transistor HN1 or HN2 of the main switch, so that the input signal is not directly transmitted to the node n4 inclusive of the input/output terminal s2. It is, however, possible that the potential of the node n4 is caused to change by crosstalk from the input signal. An excessive potential change if caused may result in breaking receiver elements.

In the present embodiment, to avoid such a result, when a signal for turning the main switch off is received, the GND switch is turned on. This causes the node n4 to be grounded, so that the potential change due to crosstalk from the input signal can be reduced. As a result, the receiver connected to the node n4 can be protected.

As described above, applying the switch circuit of the present embodiment to a T/R switch makes it possible to realize a switch circuit which is, besides having wide-band, low-noise characteristics, highly effective as a receiver protection circuit.

Fifth Embodiment

Figure 5:
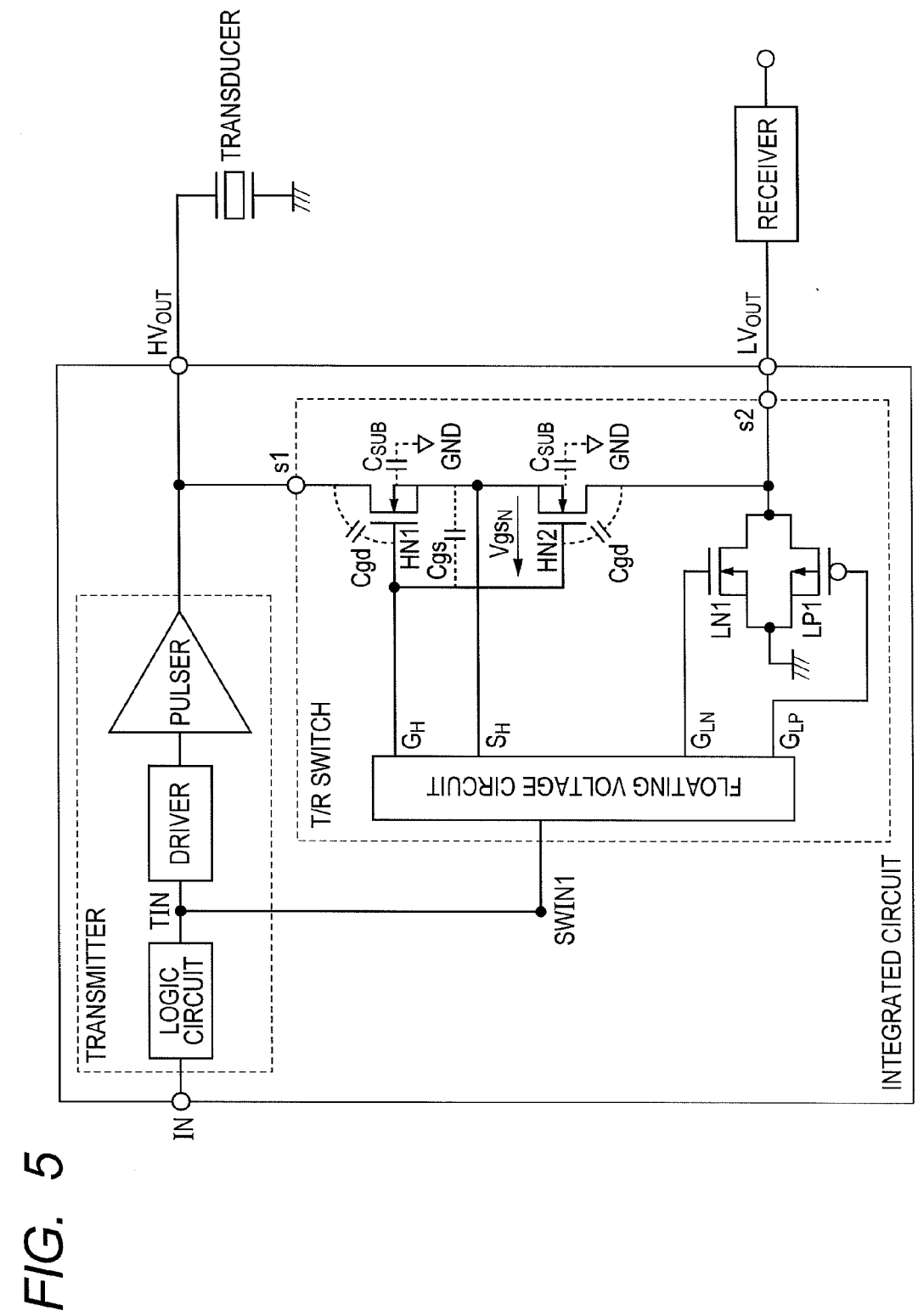
FIG. 5 is a diagram showing the configuration of a semiconductor integrated circuit according to a fifth embodiment.
Figure 6:
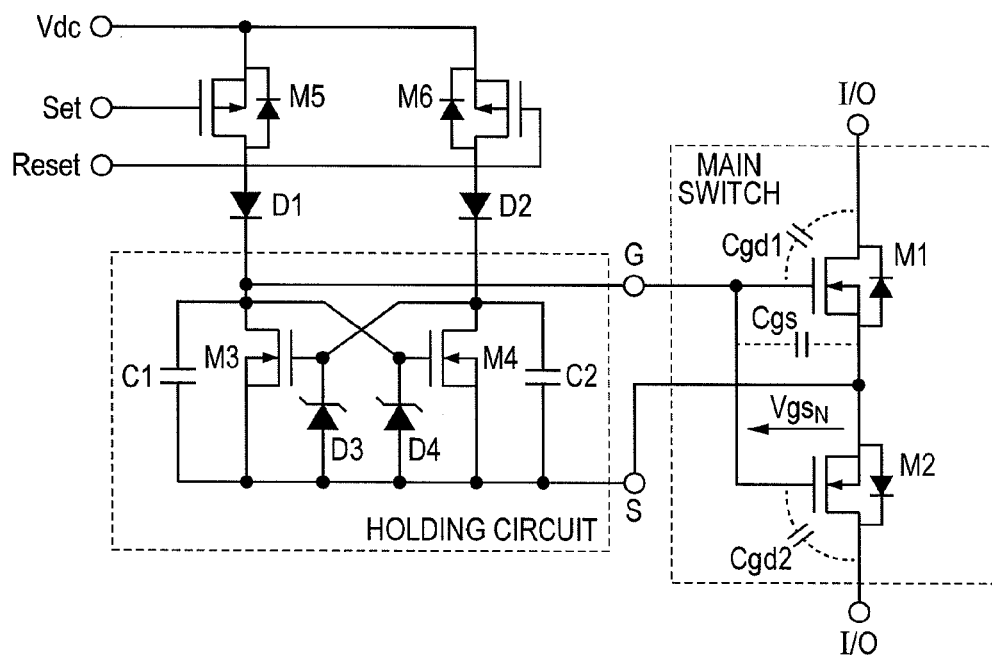
FIG. 6 is a diagram showing, for comparison purposes, a switch circuit including two MOS transistors.

FIG. 5 is a diagram showing an embodiment of a semiconductor integrated circuit including a transmitter and a T/R switch and configured on a single semiconductor substrate. The transmitter generates, based on an input logic signal, a pulse signal for transmission. The T/R switch is one to which the switch circuit shown in FIG. 4 is applied for use in an ultrasonograph.

The transmitter includes a logic circuit, a driver, and a pulser. The logic circuit transmits, based on a digital signal inputted from an input terminal IN, a drive circuit control signal TIN and a control signal for the T/R switch. The driver converts the drive circuit control signal TIN into a drive signal for the pulser. The pulser generates a transmission pulse signal having an amplitude variable range of approximately 0 to ±100 V and a frequency variable range of approximately 1 to 40 MHz.

The T/R switch includes, as described in connection with the fourth embodiment, a main switch, a floating voltage circuit, and a GND switch. The T/R switch separates the receiver and the transmitter.

The output section of the transmitter is connected to the input/output terminal s1 of the T/R switch and, via an output terminal HVout of the semiconductor integrated circuit, to a transducer formed of a piezoelectric element. The receiver that receives and amplifies a reflected signal, then converts the signal into a digital signal is connected, via an output terminal LVout, to the input/output terminal s2 of the T/R switch.

When outputting a transmission signal, the T/R switch is turned off so as to allow the transmission signal generated by the transmitter to be outputted, via HVout, to the transducer to generate ultrasonic sound waves. At this time, with the GND switch kept on, LVout connected to the receiver is fixed at 0 V thereby functioning as a receiver protection circuit.

When a reflected signal is received from the transducer, the T/R switch is switched from an off-state to an on-state and the signal received from HVout is transmitted to the receiver via LVout. The T/R switch of the present embodiment can realize a low-noise characteristic and makes it possible to transmit a received signal without degrading it in an ultrasonograph.

As described above, using the T/R switch of the present embodiment makes it possible to realize low-noise, wideband transmission in an ultrasonograph. Furthermore, using a semiconductor integrated circuit including a T/R switch and a transmitter formed on a same chip can promote device cost reduction and device miniaturization.

Preferred embodiments of the present invention have been described above, but the invention is not limited by the above embodiments. It will be easily understood by those skilled in the art that various modifications including combining two or more of the above embodiments are possible within the scope of the invention.

What is claimed is:

1. A switch circuit, comprising:
    a main switch having a first MOS transistor, to a drain terminal of which a first input/output terminal is connected, and a second MOS transistor, to a drain terminal of which a second input/output terminal is connected, wherein a source terminal of the first MOS transistor and a source terminal of the second MOS transistor are connected forming a common source terminal and wherein a gate terminal of the first MOS transistor and a gate terminal of the second MOS transistor are connected forming a common gate terminal;
    a voltage control circuit which is connected to the common source terminal and the common gate terminal of the main switch, which makes potential of the common gate terminal follow, in phase, variation in common source potential that is a potential of the common source terminal, and which controls, using a gate control signal, turning on or off of the main switch;
    wherein the voltage control circuit includes:
    a first latch circuit which is connected to a first power supply terminal and the common source terminal and which level-shifts a control signal inputted from a logic input terminal to form a control signal based on the common source potential;
    a voltage generator which is connected to the common source terminal and which generates a certain level of internal voltage based on the common source potential; and
    a second latch circuit which is connected to the common source terminal, to which the internal voltage is inputted as power supply, and which sends, based on the control signal, the gate control signal to the common gate terminal.

2. The switch circuit according to claim 1,
    wherein the voltage control circuit further comprises a noise cut circuit connected to a second power supply terminal and the common source terminal,
    wherein the first latch circuit and the voltage generator are connected to an input section of the noise cut circuit,
    wherein the second latch circuit and the common source terminal are connected to an output section of the noise cut circuit, and
    wherein the noise cut circuit causes current generated by operation of the first latch circuit and current from a constant current source for generating the internal voltage to flow to the second power supply terminal without passing the common source terminal.

3. The switch circuit according to claim 2,
    wherein the noise cut circuit includes a source-follower-connected third MOS transistor and a first diode, an anode of which is connected to a drain terminal of the third MOS transistor, and wherein a gate terminal of the third MOS transistor is connected with the common source terminal, a source terminal of the third MOS transistor is connected with the first latch circuit and the voltage generator, and a cathode of the first diode is connected with the second power supply terminal.

4. The switch circuit according to claim 3,
    wherein the source terminal of the third MOS transistor is connected to a node, and
    wherein the voltage control circuit has a second diode, an anode of which is connected to the node and a cathode of which is connected to the common source terminal.

5. The switch circuit according to claim 1, wherein the voltage control circuit has a slew rate adjuster which is connected between an output section of the voltage generator and the common gate terminal and which controls a slew rate of the gate control signal to be sent to the common gate terminal.

6. The switch circuit according to claim 5, wherein the slew rate adjuster includes a slew rate control resistor to which the internal voltage is inputted and a buffer connected to the slew rate control resistor and the common source terminal.

7. The switch circuit according to claim 1,
    wherein the switch circuit includes a GND switch which is connected to the second input/output terminal of the main switch and which is grounded, and
    wherein, when the main switch is turned off, the GND switch turns on and, when the main switch is turned on, the GND switch turns off.

8. A semiconductor circuit comprising a transmitter which outputs a transmission signal and a switch circuit which separates a receiver and the transmitter, the receiver being for amplifying the transmission signal having been reflected as a reflection signal and converting the reflection signal into a digital signal,
    wherein the switch circuit includes:
    a main switch having a first MOS transistor, to a drain terminal of which a first input/output terminal connected to an output section of the transmitter is connected, and a second MOS transistor, to a drain terminal of which a second input/output terminal connected to an input section of the receiver is connected, wherein a source terminal of the first MOS transistor and a source terminal of the second MOS transistor are connected forming a common source terminal and wherein a gate terminal of the first MOS transistor and a gate terminal of the second MOS transistor are connected forming a common gate terminal;
    a voltage control circuit which is connected to the common source terminal and the common gate terminal of the main switch, which makes potential of the common gate terminal follow, in phase, variation in common source potential that is a potential of the common source terminal, and which controls, using a gate control signal, turning on or off of the main switch;
    wherein the switch circuit is formed on a single semiconductor substrate on which the transmitter is formed;
    wherein the voltage control circuit includes:
    a first latch circuit which is connected to a first power supply terminal and the common source terminal and which level-shifts a control signal inputted from a logic input terminal to form a control signal based on the common source potential;
    a voltage generator which is connected to the common c source terminal and which generates a certain level of internal voltage based on the common source potential; and a second latch circuit which is connected to the common source terminal, to which the internal voltage is inputted as power supply, and which sends, based on the control signal, the gate control signal to the common gate terminal.

9. The semiconductor circuit according to claim 8, wherein the voltage control circuit further comprises a noise cut circuit connected to a second power supply terminal and the common source terminal,
- wherein the first latch circuit and the voltage generator are connected to an input section of the noise cut circuit,
- wherein the second latch circuit and the common source terminal are connected to an output section of the noise cut circuit, and
- wherein the noise cut circuit causes current generated by operation of the first latch circuit and current from a constant current source for generating the internal voltage to flow to the second power supply terminal without passing the common source terminal.

10. The semiconductor circuit according to claim 9,
- wherein the noise cut circuit includes a source-follower-connected third MOS transistor and a first diode, an anode of which is connected to a drain terminal of the third MOS transistor; and
- wherein a gate terminal of the third MOS transistor is connected with the common source terminal, a source terminal of the third MOS transistor is connected with the first latch circuit and the voltage generator, and a cathode of the first diode is connected with the second power supply terminal.

11. The semiconductor circuit according to claim 10,
- wherein the source terminal of the third MOS transistor is connected to a node, and
- wherein the voltage control circuit has a second diode, an anode of which is connected to the node and a cathode of which is connected to the common source terminal.

12. The semiconductor circuit according to claim 8, wherein the voltage control circuit has a slew rate adjuster which is connected between an output section of the voltage generator and the common gate terminal and which controls a slew rate of the gate control signal to be sent to the common gate terminal.

13. The semiconductor circuit according to claim 12, wherein the slew rate adjuster includes a slew rate control resistor to which the internal voltage is inputted and a buffer connected to the slew rate control resistor and the common source terminal.

14. The semiconductor circuit according to claim 8,
- wherein the switch circuit includes a GND switch which is connected to the second input/output terminal of the main switch and which is grounded; and
- wherein, when the main switch is turned off, the GND switch turns on and, when the main switch is turned on, the GND switch turns off

\* \* \* \* \*